United States Patent [19]

Ferrario

[11] Patent Number: 5,555,168
[45] Date of Patent: Sep. 10, 1996

[54] FREQUENCY MODULATED, SWITCHING POWER SUPPLY

[75] Inventor: Bruno Ferrario, Fino Mornasco, Italy

[73] Assignee: SGS-Thomson Microelectronics, S.r.l., Agrate Brianza, Italy

[21] Appl. No.: 98,651

[22] Filed: Jul. 28, 1993

[30] Foreign Application Priority Data

Jul. 28, 1992 [EP] European Pat. Off. ............ 92830418.7

[51] Int. Cl.$^6$ .................................................. H02M 7/155
[52] U.S. Cl. .............................. 363/89; 323/282; 323/299
[58] Field of Search .................................. 363/44, 45, 82, 363/89, 90, 126; 323/222, 282, 299, 300

[56] References Cited

U.S. PATENT DOCUMENTS

| | | | |
|---|---|---|---|
| 3,946,330 | 3/1976 | Takahashi | 331/8 |
| 4,712,169 | 12/1987 | Albach | 363/89 |
| 4,816,982 | 3/1989 | Severinsky | 363/44 |
| 5,357,418 | 10/1994 | Clavel | 363/89 |

FOREIGN PATENT DOCUMENTS

| | | |
|---|---|---|
| 0233315 | 11/1986 | European Pat. Off. . |
| 8501400 | 3/1985 | WIPO . |

Primary Examiner—Peter S. Wong
Assistant Examiner—Adolf Berhane
Attorney, Agent, or Firm—Robert Groover; Betty Formby

[57] ABSTRACT

A switching power supply in which the oscillation frequency is dynamically controlled to have an instantaneous frequency value which is reduced when the power line waveform is near its peaks. This is preferably accomplished by a divider circuit, which provides an output current proportional to the ratio between the instantaneous value of the rectified voltage and the long-term-averaged value of that voltage. This output current is fed into a ramp generator, to dynamically shift the frequency of the ramp generator as the output current changes. This circuit is indifferent to power line voltage and frequency (over a fairly wide range), and therefore may be used in different countries having different power standards.

24 Claims, 2 Drawing Sheets

FREQUENCY MODULATED, SWITCHING POWER SUPPLY

CROSS-REFERENCE TO RELATED APPLICATION

This application claims priority from European App'n 92830418.7, filed Jul. 28, 1992, which is hereby incorporated by reference.

BACKGROUND AND SUMMARY OF THE INVENTION

The present invention relates to a switching power supply circuit for a direct connection to an AC power outlet. More generally it relates to a frequency modulator circuit which is suited for modulating the switching frequency of a power supply to produce a rectified AC voltage.

The so-called switching type power supplies are widely used circuits within electronic and electromechanical appliances. They provide a low-voltage DC supply through a rectifier circuit which may be connected to the AC power outlet without using a step-down transformer. However, the absence of a transformer permits electromagnetic disturbances to propagate into the power network. This is undesirable, and is likely to be increasingly constrained by regulations.

The main frequency of these disturbances is related to the switching frequency of the power supply circuit. This frequency may correspond to a value which interferes with telecommunication circuits using the power distribution line as a signal path.

Commonly the oscillator used for determining an oscillation frequency for a switching-type power supply contains a ramp generator circuit. In this circuit, an output ramp signal is fed to an input of a comparator. Another input of the comparator is fed with a reference voltage to determine a triggering threshold. This charges and discharges capacitors of the ramp generator. The resulting frequency of oscillation is predetermined by selecting the appropriate resistance and capacitance values (i.e. by selecting an RC time constant). The ramp generator may contain a constant current generator which itself may contain a buffer capable of forcing a certain constant current through a resistance. The constant current is mirrored in the charge/discharge network of the capacitor of the ramp generator circuit.

In the present invention it has been found that by modulating the oscillation frequency to have an instantaneous frequency value which is inversely proportional to the instantaneous amplitude of the rectified AC voltage two important effects can be achieved. First, by reducing the oscillation frequency under conditions of high current, the electromagnetic energy associated with disturbances is reduced. Secondly, a reduction of the oscillation frequency when current is high also reduces power loss through the power switch. In other words, under conditions of high current, a reduction in frequency results in a more efficient and noise free circuit.

In a preferred embodiment of the invention, the modulation of the oscillation frequency in a rectifier circuit containing a voltage ramp generator is implemented by means of a divider having two inputs and an output. The first input fed with the output of a standard bridge rectifier. The second input is fed with the RMS value of the rectified voltage. This voltage may be obtained as the output of a low-pass filter which may be connected across the output nodes of the bridge rectifier.

The voltage divider circuit generates an output current which is proportional to the ratio of its two inputs (proportional to Vin, and inversely proportional to Vrms). The output current (Iout) generated by the divider is used to modulate the oscillation frequency and has an instantaneous value of the rectified AC voltage (Vin). Therefore, the value of the output current (Iout) is dependent on only the design parameters of the circuit itself and not the value of the RMS-AC voltage. (This voltage may vary in different countries.)

The output node of the frequency modulating circuit (i.e. the divider circuit) may be directly connected to the load used by the constant current source of the ramp generator circuit. This is done in order to subtract a variable current generated by the modulating circuit.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
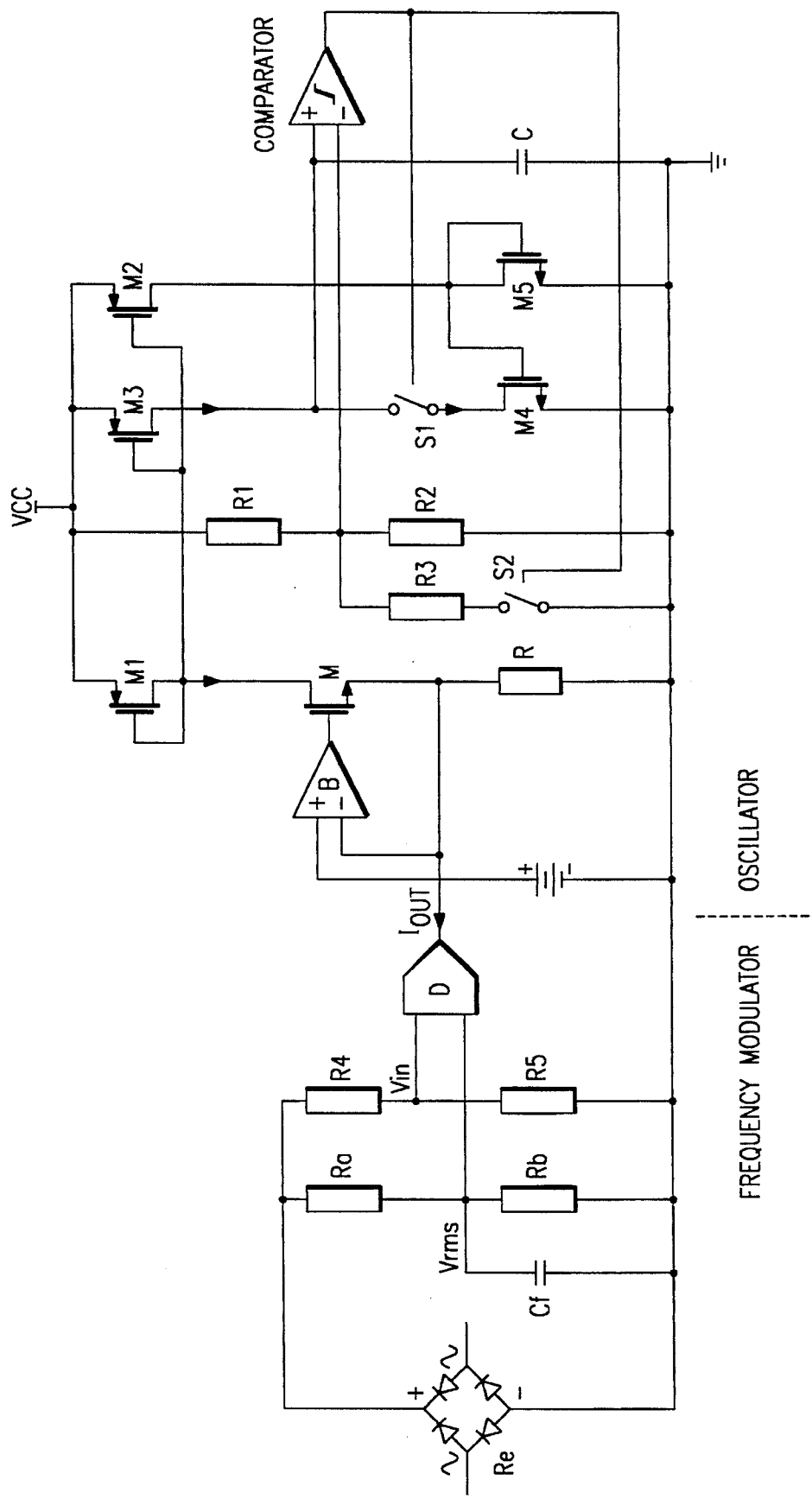
FIG. 1 is a schematic drawing of a power supply circuit according to a sample embodiment of the present invention.

In FIG. 1 a typical oscillating circuit (labelled "Oscillator") commonly used in switching-type power supplies is composed of a voltage ramp generator and a comparator ("Comp."). The triggering threshold of this circuit is established by means of a voltage divider formed by resistors R1 and R2. The voltage ramp generator contains a capacitor C, which may be charged by current delivered from transistor M3 and discharged through switch S1. which is driven by the comparator Comp.

The frequency of the oscillation is adjusted by establishing a certain charge/discharge current through the capacitor C. This is achieved by means of a constant current generator which contains a buffer B capable of controlling a transistor M0, which in turn forces a certain current through resistor R. The value of this current is mirrored in transistors M1, M2 and M5 on the charge cycle and is mirrored in transistors M3 and M4 in the discharge cycle. A second switch S2 is driven by the comparator (Comp.) and has the purpose of connecting resistor R3 in parallel with resistor R2 in order to lower the triggering threshold of comparator Comp.

In the preferred embodiment, the predetermined frequency of oscillation is modulated as a function of the instantaneous value of the rectified AC voltage. This is accomplished by employing the circuit labeled "Frequency Modulator." It contains a divider circuit D which has two inputs; a rectifier Re; and voltage dividers formed from resistors.

In the preferred embodiment, a first input voltage Vin of the block D is connected to a common node between R4 and R5. The non-common nodes of these resistors are connected across the outputs of the bridge rectifier Re. The inputs of bridge rectifier Re are connected to an AC source, e.g. a typical wall outlet.

The second input of block D is connected to the output node Vrms of a low-pass filter which is formed by resistor Ra, Rb, and capacitor Cf. It should be noted that in this embodiment Vrms is a DC voltage without substantial ripple.

Figure 2:
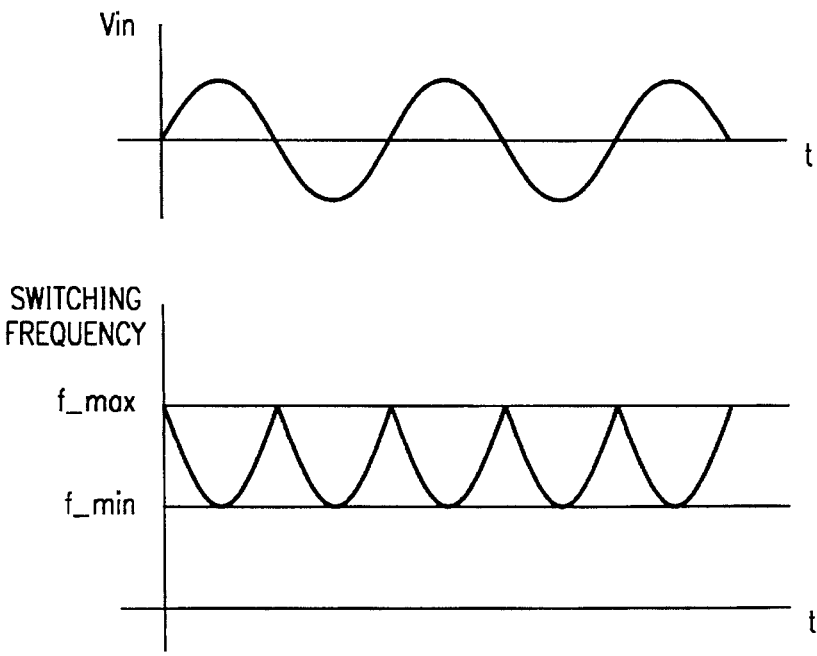
FIG. 2 shows timing diagrams of the oscillator.

The divider circuit D produces, on its output, a current which is given by $$I_{OUT} = G \frac{V_{in}(t)}{V_{RMS}(t)}$$

where Vin is a divided voltage as shown in FIG. 2.

The current Iout produced by the frequency modulator circuit is subtracted from the preestablished charge/discharge current of the capacitor C and therefore modulates the frequency of oscillation between a maximum value, which corresponds to frequency of oscillation of the oscillator circuit, and a minimum value which is reached coincident with the peak value of the modulating current Iout. Therefore, the frequency of oscillation will be variable and also inversely proportional to the instantaneous value of the rectified AC voltage with respect to its RMS value. A timing diagram for this process is shown as FIG. 2.

As the diagram implies, as Vin approaches 0 the switching frequency is near its peak value. As Vin approaches either positive or negative peaks the switching frequency approaches its minimum. In a sample typical values for fmax could be approximately 100–150 KHz, and typical values for fmin could be 10% of fmax. (However, it will be recognized by those skilled in the art of power supply system design that these values, and particularly fmax, may be varied in accordance with the needs of particular applications.)

The modulating current Iout produced by the frequency modulating circuit in the invention will have a value which depends exclusively on design parameters and NOT the value of the RMS AC voltage. Therefore, a switching power supply having a modulated frequency in accordance with the present invention may be used in different locations that have different AC frequency standards, without alteration of performance.

Figure 3:
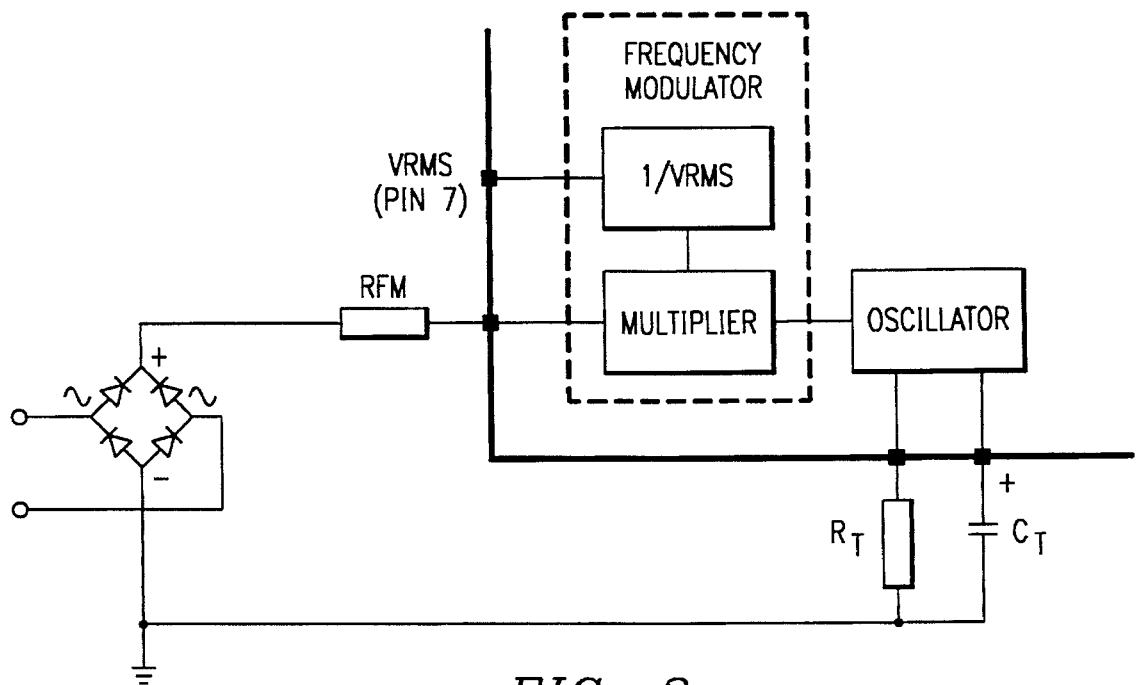
FIG. 3 shows a block diagram of the presently preferred embodiment of the invention.

Another advantage of the disclosed circuit is that it may be "retrofitted" or added onto an already existing oscillator circuit without need for redesign. FIG. 3 is a larger-scale block diagram of a sample system which combines the frequency modulator and oscillator of FIG. 1 with an additional capacitor (Cr) and resistor (Rr). This resistor and capacitor may be chosen to alter the switching frequency of the invention. These components may be external (e.g. on a printed circuit board) or integrated. The maximum frequency will be determined by the already existing oscillator circuit. The minimum frequency will continue to be a function of design parameters and can be pre-determined according to need.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A switching power supply, for connection to an AC power line, comprising:

a bridge rectifier connectable to the power line;

an oscillator;

a division circuit configured and connected to provide a ratio output proportional to a ratio between an instantaneous output voltage of said rectifier and a long-term-average of the output voltage of said rectifier; and a control circuit connected to said division circuit and said oscillator to dynamically shift the frequency of said oscillator in accordance with the value of said ratio;

whereby said control circuit operates independently of the voltage and frequency of the power line voltage.

2. The power supply of claim 1, wherein said oscillator includes a ramp generator connected to an input of a comparator.

3. The power supply of claim 1, wherein said oscillator includes a ramp generator including a constant current source, and said control circuit provides an additional variable current in addition to the output of said constant current source.

4. The power supply of claim 1, further comprising switching transistors connected to be operated by an output of said oscillator.

5. The power supply of claim 1, wherein said control circuit provides a current output.

6. The power supply circuit of claim 1, wherein said bridge rectifier is connectable directly to power line terminals without any filter stage.

7. A switching power supply, for connection to an AC power line, comprising:

a bridge rectifier connectable to the power line, and having outputs connected to provide a corresponding full-wave-rectified output;

a first voltage divider comprising first and second resistors connected in series across said output of said rectifier to provide a first voltage proportional to the voltage of said output;

a second voltage divider comprising third and fourth resistors connected in series across said output of said rectifier to provide a second voltage proportional to the voltage of said output, said second voltage being connected to an averaging capacitor;

an oscillator;

a control circuit connected to sense the ratio between said first voltage and said second voltage, and connected to dynamically shift the frequency of said oscillator in accordance with the value of said ratio;

whereby said control circuit operates independently of the voltage and frequency of the power line voltage.

8. The power supply of claim 7, wherein said oscillator includes a ramp generator connected to an input of a comparator.

9. The power supply of claim 7, wherein said oscillator includes a ramp generator including a constant current source, and said control circuit provides an additional variable current in addition to the output of said constant current source.

10. The power supply of claim 7, further comprising switching transistors connected to be operated by an output of said oscillator.

11. The power supply of claim 7, wherein said control circuit provides a current output.

12. The power supply circuit of claim 7, wherein said bridge rectifier is connectable directly to power line terminals without any filter stage.

13. A switching power supply, for connection to an AC power line, comprising:
- a bridge rectifier connectable to the power line, and having outputs connected to provide a corresponding full-wave-rectified output;
- a first voltage divider comprising first and second resistors connected in series across said output of said rectifier to provide a first voltage proportional to the voltage of said output;
- a second voltage divider comprising third and fourth resistors connected in series across said output of said rectifier to provide a second voltage proportional to the voltage of said output, said second voltage being connected to an averaging capacitor;
- a division circuit configured and connected to provide a ratio output proportional to a ratio between second voltage and said first voltage;
- an oscillator;
- a control circuit connected to dynamically shift the frequency of said oscillator in accordance with the value of said ratio output of said division circuit;
- whereby said control circuit operates independently of the voltage and frequency of the power line voltage.

14. The power supply of claim 11, wherein said division circuit provide said ratio output to be directly proportional to said second voltage and inversely proportional to said first voltage.

15. The power supply of claim 11, wherein said division circuit provides said ratio output to be a linear function of said ratio.

16. The power supply of claim 11, wherein said oscillator includes a ramp generator connected to an input of a comparator.

17. The power supply of claim 11, wherein said oscillator includes a ramp generator including a constant current source, and said control circuit provides an additional variable current in addition to the output of said constant current source.

18. The power supply of claim 11, further comprising switching transistors connected to be operated by an output of said oscillator.

19. The power supply of claim 11, wherein said control circuit provides a current output.

20. The power supply circuit of claim 13, wherein said bridge rectifier is connectable directly to power line terminals without any filter stage.

21. A method for operating a switch power supply, comprising the steps of:
- (a.) providing a bridge rectifier which is directly connectable to a power line to provide a full-wave-rectified voltage proportional thereto;
- (b.) operating an oscillator to control switching transistors; while
- (c.) dynamically sensing the ratio between an instantaneous output voltage of said rectifier and a long-term-average thereof, and dynamically shifting the frequency of said oscillator in accordance with the value of said ratio;
- whereby said step (c.) is independent of the voltage and frequency of the power line voltage.

22. The method of claim 21, wherein said oscillator includes a ramp generator connected to an input of a comparator.

23. The method of claim 21, wherein said oscillator includes a ramp generator including a constant current source, and said control circuit provides an additional variable current in addition to the output of said constant current source.

24. A switching-type power supply for direct connection to an AC power distribution network, comprising
- a voltage ramp type oscillator, the frequency of oscillation of which is determined by a charge current and a discharge current of a capacitance;
- a circuit capable of varying said charge and discharge currents in an inversely proportional relationship with the instantaneous amplitude of a rectified AC voltage, thus modulating said oscillation frequency in an inversely proportional relationship with said instantaneous amplitude of the rectified AC voltage of said distribution network; and
- a divider circuit having a first and a second input and an output, the first input being connected to the output node of a low-pass filter connected in cascode to a rectifier circuit of said AC voltage, the second input being connected to an intermediate node of a voltage divider functionally connected to the output of said rectifier circuit and the output node being functionally connected to the output node of a generator of said charge and discharge currents;
- said circuit producing through said output a current proportional to the instantaneous value of the rectified AC voltage, present on said first input, divided by an RMS value of said AC voltage, present on said second input.

* * * * *